(12) United States Patent
Mun et al.

(10) Patent No.: US 9,593,205 B2
(45) Date of Patent: Mar. 14, 2017

(54) POLYMER, ORGANIC LAYER COMPOSITION, ORGANIC LAYER, AND METHOD OF FORMING PATTERNS

(71) Applicant: SAMSUNG SDI CO., LTD., Yongin-si, Gyeonggi-do (KR)

(72) Inventors: Soo-Hyoun Mun, Suwon-si (KR); Hyo-Young Kwon, Suwon-si (KR); Seung-Hyun Kim, Suwon-si (KR); Ran Namgung, Suwon-si (KR); Dominea Rathwell, Suwon-si (KR); Hyeon-Il Jung, Suwon-si (KR); Yu-Mi Heo, Suwon-si (KR)

(73) Assignee: SAMSUNG SDI CO., LTD., Yongin-Si, Gyeonggi-Do (KR)

(*) Notice: Subject to any disclaimer, the term of this patent is extended or adjusted under 35 U.S.C. 154(b) by 0 days.

(21) Appl. No.: 14/936,023

(22) Filed: Nov. 9, 2015

(65) Prior Publication Data

US 2016/0152771 A1    Jun. 2, 2016

(30) Foreign Application Priority Data

Nov. 28, 2014    (KR) ........................ 10-2014-0169131

(51) Int. Cl.

| *H01L 21/26* | (2006.01) |
|---|---|
| *H01L 21/42* | (2006.01) |
| *C08G 73/06* | (2006.01) |
| *G03F 7/004* | (2006.01) |
| *H01L 21/311* | (2006.01) |
| *H01L 21/308* | (2006.01) |
| *H01L 21/3213* | (2006.01) |
| *H01L 21/027* | (2006.01) |
| *H01L 21/033* | (2006.01) |

(52) U.S. Cl.
CPC ......... *C08G 73/0672* (2013.01); *G03F 7/004* (2013.01); *H01L 21/0276* (2013.01); *H01L 21/0332* (2013.01); *H01L 21/0337* (2013.01); *H01L 21/3081* (2013.01); *H01L 21/3086* (2013.01); *H01L 21/31144* (2013.01); *H01L 21/32139* (2013.01)

(58) Field of Classification Search
CPC .......... H01L 21/0332; H01L 21/31144; H01L 21/0276; H01L 21/02123; H01L 21/02332; H01L 21/0262; H01L 21/3141; H01L 21/467; H01L 21/475; H01L 21/762; H01L 21/02219; H01L 21/02642; H01L 21/0228; H01L 21/02672; H01L 51/0006; H01L 51/0034
USPC ....... 438/680, 746, 780, 782, 786, 311, 474, 438/513, 551, 553, 756, 757, 791; 257/E21.006, E21.007, E21.023, 257/E21.041, E21.054, E21.17, E21.267, 257/E21.278, E21.293, E21.314, E21.32, 257/E21.347

See application file for complete search history.

(56) References Cited

U.S. PATENT DOCUMENTS

| 7,618,889 | B2* | 11/2009 | Naik | ................ | H01L 21/31116 438/638 |
|---|---|---|---|---|---|
| 7,781,154 | B2* | 8/2010 | Parikh | ............... | H01L 21/31144 430/313 |
| 2007/0231750 | A1* | 10/2007 | Parikh | ............... | H01L 21/31144 430/316 |
| 2008/0020570 | A1* | 1/2008 | Naik | ................ | H01L 21/31116 438/675 |
| 2015/0221793 | A1* | 8/2015 | Okubo | ............ | H01L 31/022466 136/256 |

FOREIGN PATENT DOCUMENTS

| JP | 4029288 B2 | 1/2008 |
|---|---|---|
| KR | 10-2011-0079201 A | 7/2011 |
| KR | 10-2012-0068378 A | 6/2012 |
| KR | 10-2014-0034504 A | 3/2014 |
| TW | 201305238 A | 2/2013 |
| WO | WO 2010/147155 A1 | 12/2010 |
| WO | WO 2011/099235 A1 | 8/2011 |
| WO | WO 2011/102470 A1 | 8/2011 |
| WO | WO 2012/077640 A1 | 6/2012 |
| WO | WO 2012/096071 A1 | 7/2012 |
| WO | WO 2014/038567 A1 | 3/2014 |

OTHER PUBLICATIONS

Taiwanese Search Report dated Oct. 18, 2016 for corresponding Taiwanese Patent Application No. 104137788; Soo-Hyoun Mun, et al.

* cited by examiner

*Primary Examiner* — David Nhu
(74) *Attorney, Agent, or Firm* — Lee & Morse, P.C.

(57) ABSTRACT

A polymer, an organic layer composition including the polymer, an organic layer formed from the organic layer composition, and a method of forming patterns using the organic layer composition, the polymer including a moiety represented by Chemical Formula 1:

$$*-A^1-A^3+A^2-A^4+{}_n*. \qquad \text{[Chemical Formula 1]}$$

17 Claims, No Drawings

POLYMER, ORGANIC LAYER COMPOSITION, ORGANIC LAYER, AND METHOD OF FORMING PATTERNS

CROSS-REFERENCE TO RELATED APPLICATION

Korean Patent Application No. 10-2014-0169131, filed on Nov. 28, 2014, in the Korean Intellectual Property Office, and entitled: "Polymer, Organic Layer Composition, Organic Layer, and Method of Forming Patterns," is incorporated by reference herein in its entirety.

BACKGROUND

1. Field

Embodiments relate to a polymer, an organic layer composition, an organic layer, and a method of forming patterns.

2. Description of the Related Art

Recently, the semiconductor industry has developed to an ultra-fine technique having a pattern of several to several tens nanometer size. Such ultrafine technique uses effective lithographic techniques. A lithographic technique may include providing a material layer on a semiconductor substrate; coating a photoresist layer thereon; exposing and developing the same to provide a photoresist pattern; and etching the material layer using the photoresist pattern as a mask.

SUMMARY

Embodiments are directed to a polymer, an organic layer composition, an organic layer, and a method of forming patterns.

The embodiments may be realized by providing a polymer including a moiety represented by Chemical Formula 1:

[Chemical Formula 1]

wherein, in Chemical Formula 1, $A^1$ and $A^2$ are each independently a divalent nitrogen atom-containing aromatic ring group, provided that the nitrogen atom of the nitrogen atom-containing aromatic ring group is bonded with a substituted or unsubstituted C1 to C30 alkyl group, a substituted or unsubstituted C1 to C30 alkyl group including at least one oxygen atom (—O—), a carbonyl (—C(=O)—)-containing group, or a combination thereof, $A^3$ and $A^4$ are each independently a divalent group represented by Chemical Formula 2, and n is 0 or 1,

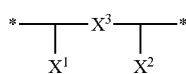
[Chemical Formula 2]

wherein, in Chemical Formula 2, $X^1$ and $X^2$ are each independently substituted or unsubstituted C6 to C30 aryl group, and $X^3$ is a substituted or unsubstituted C6 to C50 arylene group, and wherein * indicates a linking point.

The nitrogen atom-containing aromatic ring group may be a group of one of the following compounds:

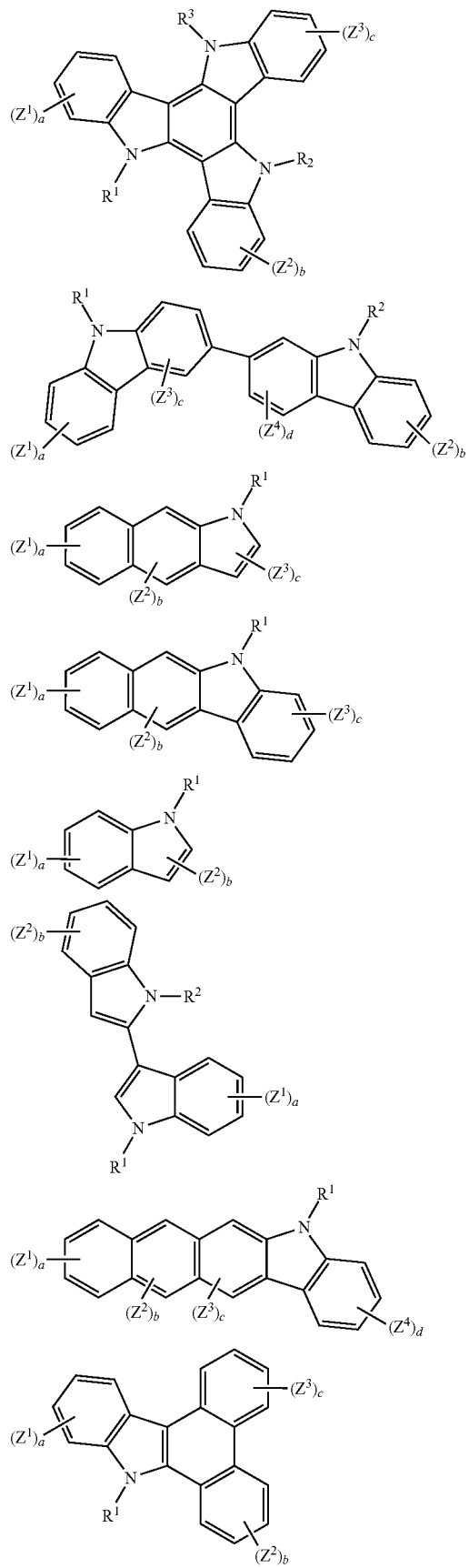

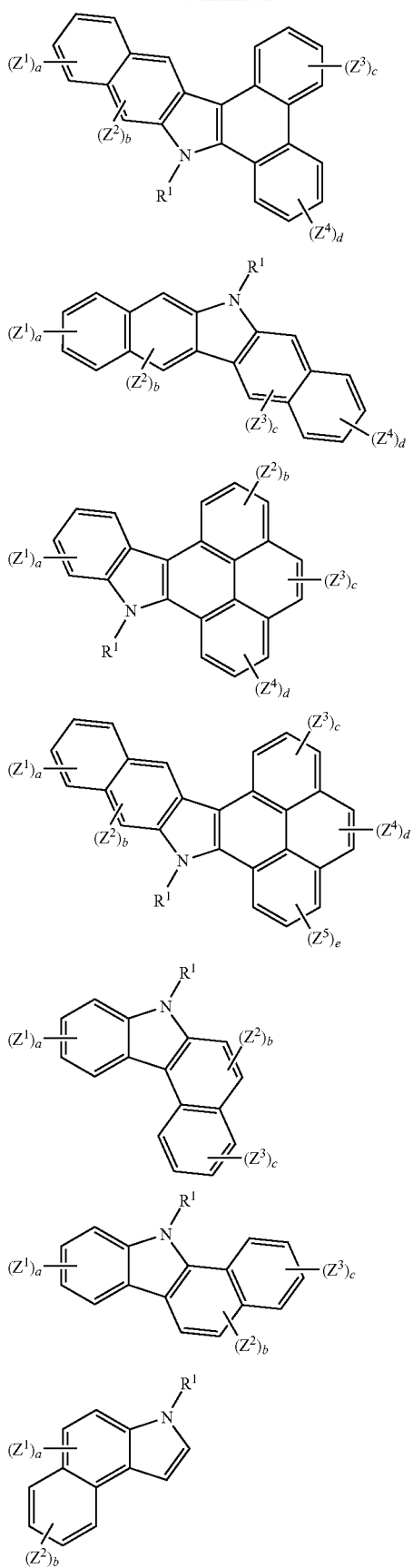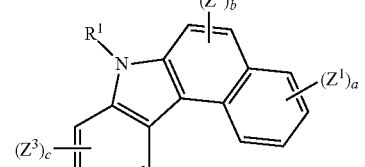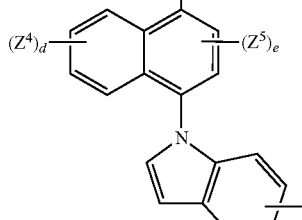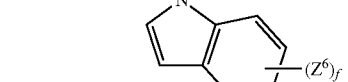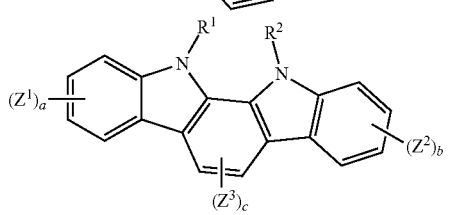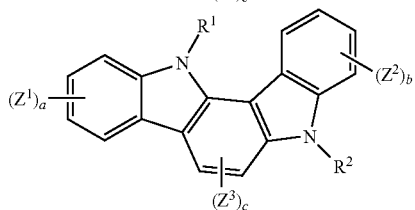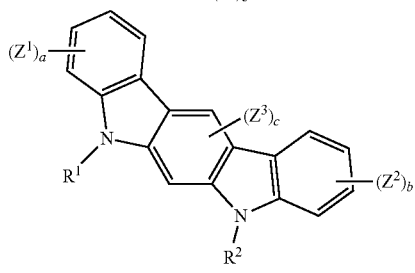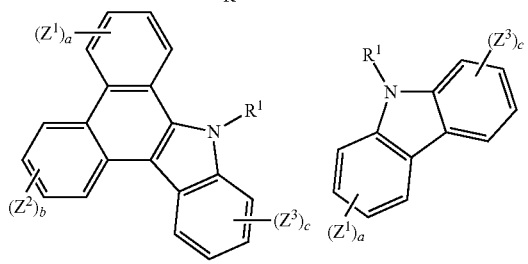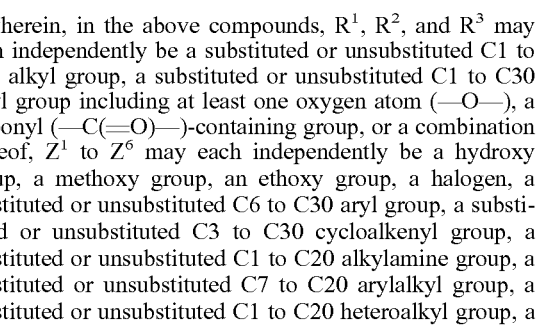

wherein, in the above compounds, $R^1$, $R^2$, and $R^3$ may each independently be a substituted or unsubstituted C1 to C30 alkyl group, a substituted or unsubstituted C1 to C30 alkyl group including at least one oxygen atom (—O—), a carbonyl (—C(=O)—)-containing group, or a combination thereof, $Z^1$ to $Z^6$ may each independently be a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e, and f may each independently be an integer of 0 to 2.

$R^1$, $R^2$, and $R^3$ may each independently be a group including at least three carbons.

$R^1$, $R^2$, and $R^3$ may each independently be a group represented by one of Chemical Formulae 3 to 6:

[Chemical Formula 3]
$$—(C_kH_{2k+1})$$

[Chemical Formula 4]
$$—\overset{O}{\underset{\|}{C}}—(C_kH_{2k+1})$$

[Chemical Formula 5]
$$—((C_mH_{2m})—O)_t—(C_kH_{2k+1})$$

[Chemical Formula 6]
$$—\overset{O}{\underset{\|}{C}}—O—(C_kH_{2k+1})$$

wherein in Chemical Formulae 3 to 6, k, m, and t may each independently be an integer of 1 to 10.

In Chemical Formula 3, k may be an integer of 3 to 10.

In Chemical Formula 6, $—(C_kH_{2k+1})$ is a t-butyl group.

In Chemical Formula 2, the C6 to C30 aryl group may be a monovalent group including one of the following moieties:

 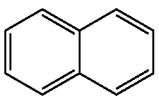 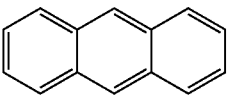

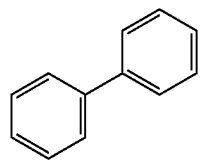 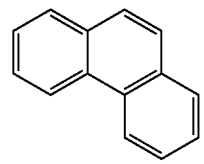

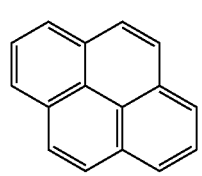 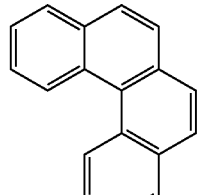

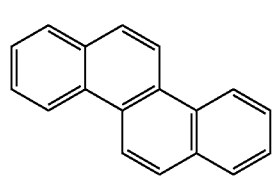 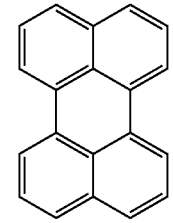

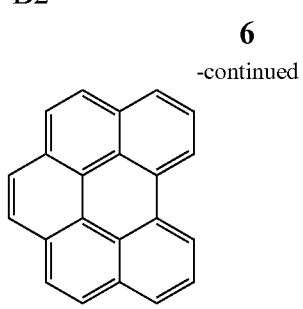

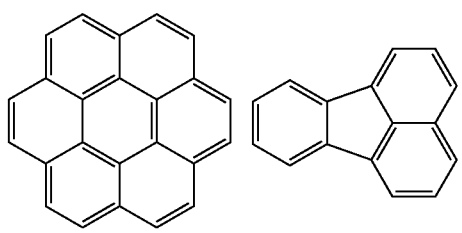

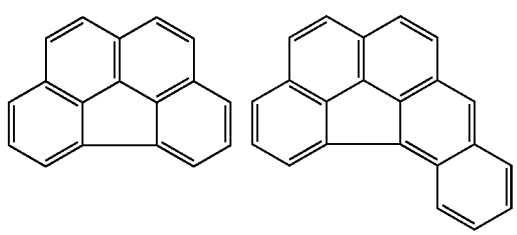

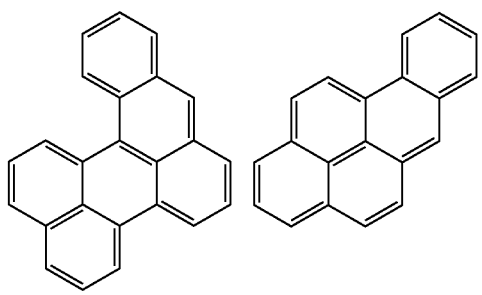

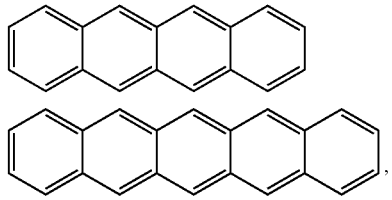

and the C6 to C50 arylene group may be a divalent group including one of the following moieties:

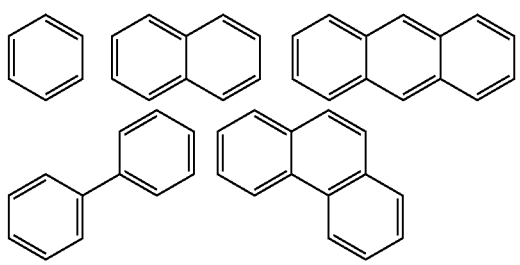

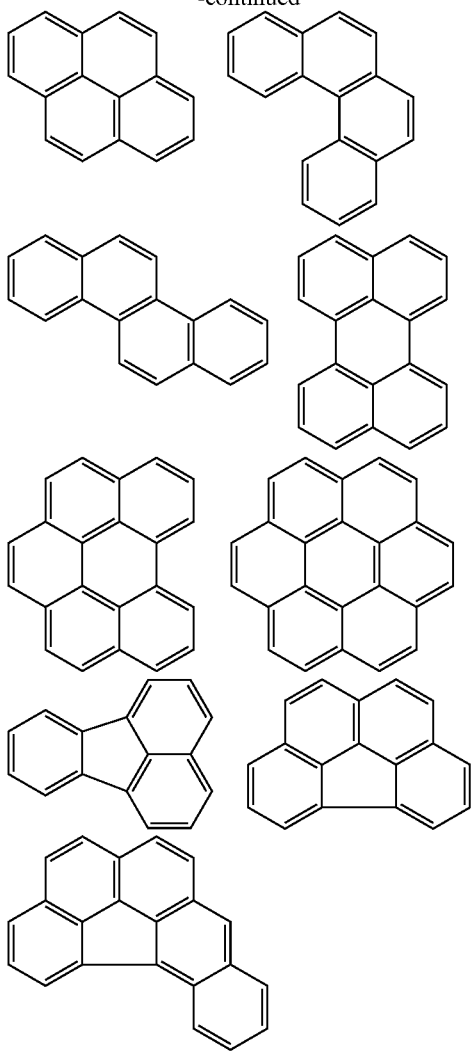
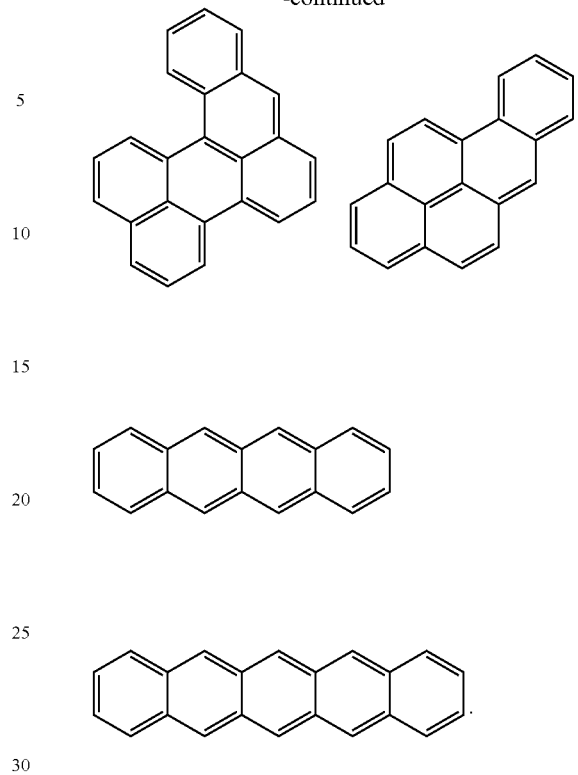

In Chemical Formula 2, at least one of $X^1$, $X^2$, and $X^3$ may be a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

The polymer may include a repeating unit represented by one of Chemical Formulae 1-1 to 1-4:

[Chemical Formula 1-1]

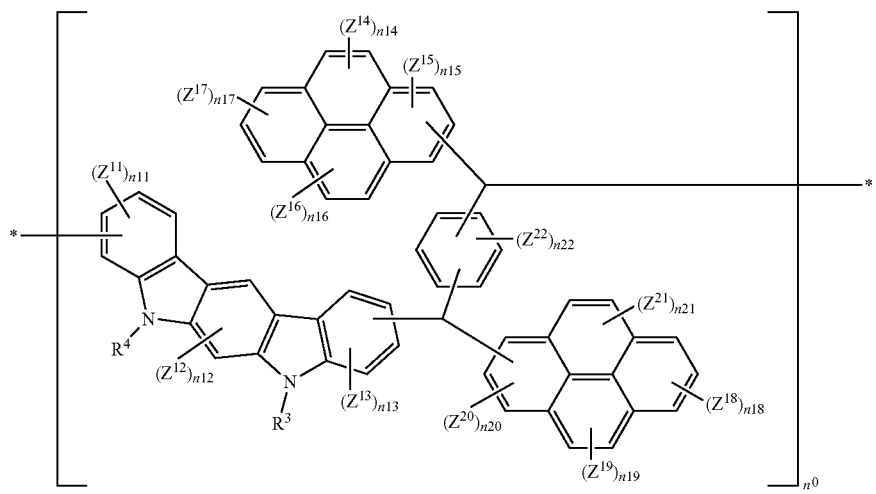

[Chemical Formula 1-2]
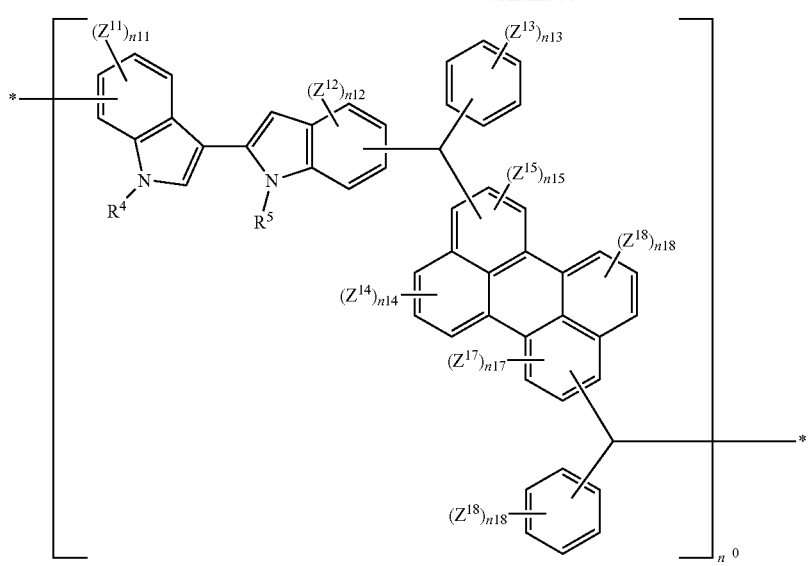
[Chemical Formula 1-3]
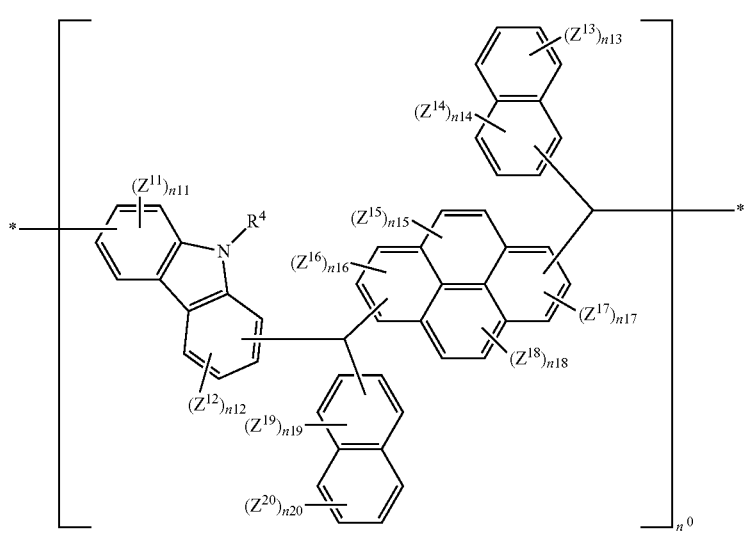
[Chemical Formula 1-4]
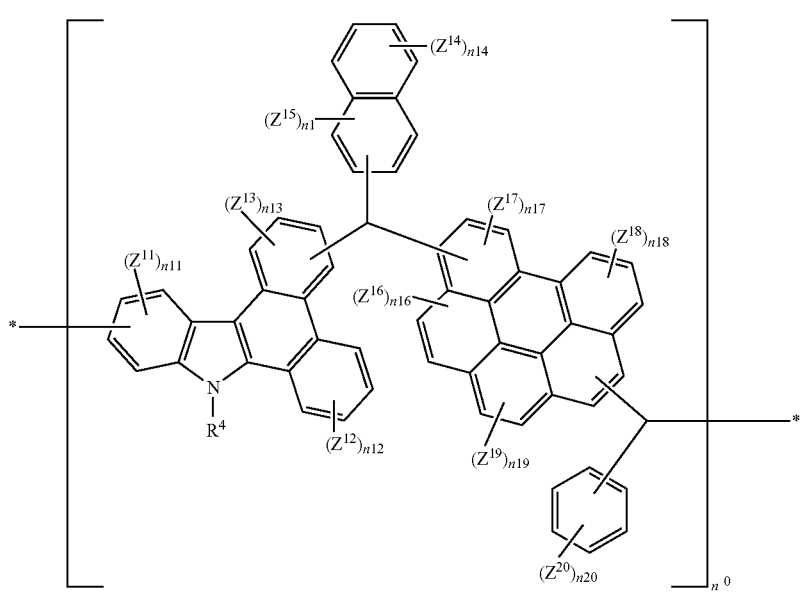

wherein, in Chemical Formulae 1-1 to 1-4, $R^4$ and $R^5$ may each independently be a substituted or unsubstituted C1 to C30 alkyl group, a substituted or unsubstituted C1 to C30 alkyl group including at least one oxygen atom (—O—), a carbonyl (—C(=O)—)-containing group, or a combination thereof, $Z^{11}$ to $Z^{22}$ may each independently be a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, $n^{11}$ to $n^{22}$ may each independently be an integer of 0 to 2, n° may be an integer of 2 to 300, and * indicates a linking point.

The polymer may have a weight average molecular weight of about 1,000 to about 200,000.

The embodiments may be realized by providing an organic layer composition including the polymer according to an embodiment; and a solvent.

The polymer may be present in an amount of about 0.1 wt % to about 30 wt %, based on a total weight of the organic layer composition.

The embodiments may be realized by providing an organic layer obtained by curing the organic layer composition according to an embodiment.

The organic layer may be a hardmask layer.

The embodiments may be realized by providing a method of forming patterns, the method including providing a material layer on a substrate; applying the organic layer composition according to an embodiment on the material layer; heat-treating the organic layer composition to form a hard mask layer; forming a silicon-containing thin layer on the hard mask layer; forming a photoresist layer on the silicon-containing thin layer; exposing and developing the photoresist layer to form a photoresist pattern; exposing and developing the photoresist layer to form a photoresist pattern; selectively removing the silicon-containing thin layer using the photoresist pattern to expose a part of the material layer; and etching an exposed part of the material layer.

Applying the organic layer composition may include performing a spin-on coating method.

Heat-treating the organic layer may be performed at about 100° C. to about 500° C.

The method may further include forming a bottom anti-reflective coating prior to forming the photoresist layer.

The silicon-containing thin layer may include SiCN, SiOC, SiON, SiOCN, SiC, SiN, or a combination thereof.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of a hydrogen atom of a compound.

As used herein, when a definition is not otherwise provided, the term 'hetero' refers to one including 1 to 3 heteroatoms selected from B, N, O, S, and P.

As used herein, when a definition is not otherwise provided, '*' indicates a linking point of a compound or a moiety of a compound.

In addition, 'a monovalent group' derived from or of an A compound refers to a monovalent group substituting one hydrogen to form a linking point in the A compound (e.g., replacing one hydrogen with a bonding location). For example, a monovalent group derived from or of benzene is a phenyl group. In addition, 'a divalent group' derived from or of an A compound refers to a divalent group substituting two hydrogen to form two linking points in the A compound. For example, a divalent group derived from or of benzene is a phenylene group.

Hereinafter, a polymer according to one embodiment is described.

A polymer according to one embodiment may include a moiety represented by Chemical Formula 1.

[Chemical Formula 1]

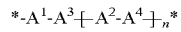          [Chemical Formula 1]

In Chemical Formula 1, $A^1$ and $A^2$ may each independently be, e.g., a divalent group derived from or of a nitrogen atom-containing aromatic ring group or compound. For example, $A^1$ and $A^2$ may each independently be a divalent nitrogen atom-containing aromatic ring group.

$A^3$ and $A^4$ may each independently be, e.g., a divalent group represented by Chemical Formula 2.

n may be 0 or 1.

In an implementation, the nitrogen atom of the nitrogen atom-containing aromatic ring group may be bonded with a substituted or unsubstituted C1 to C30 alkyl group, a substituted or unsubstituted C1 to C30 alkyl group interrupted by or including at least one oxygen atom (—O—), a carbonyl (—C(=O)—)-containing group (e.g., included in a backbone or chain thereof between carbon atoms), or a combination thereof

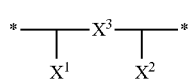          [Chemical Formula 2]

In Chemical Formula 2, $X^1$ and $X^2$ may each independently be or include, e.g., a substituted or unsubstituted C6 to C30 aryl group.

$X^3$ may be or may include, e.g., a substituted or unsubstituted C6 to C50 arylene group.

The polymer may include a plurality of the moiety represented by Chemical Formula 1, and the plurality of the moiety may have the same structure or a different structure one another.

The moiety represented by Chemical Formula 1 has a structure including a nitrogen atom-containing aromatic ring group moiety represented by $A^1$ and $A^2$ and an aromatic ring group moiety (e.g., without a nitrogen atom) represented by $A^3$ and $A^4$.

First, the nitrogen atom-containing aromatic ring group moiety is described.

In an implementation, the polymer may include a divalent group derived from or of a nitrogen atom-containing aromatic ring group or compound, and the nitrogen atom may be bonded with a predetermined substituent except or other than a hydrogen atom.

For example, the substituted or unsubstituted nitrogen atom-containing aromatic ring group may be a group of one of the following compounds.

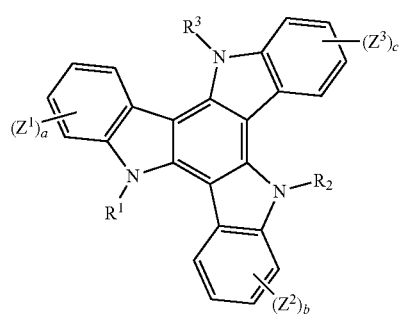
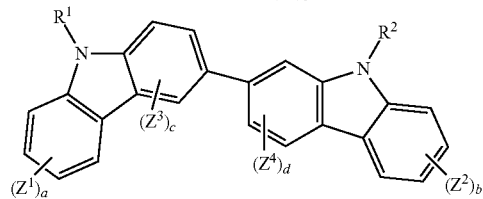
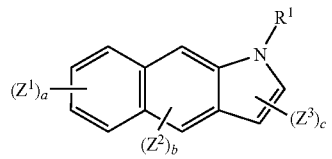
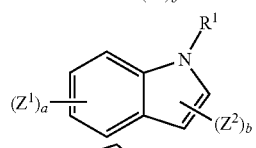
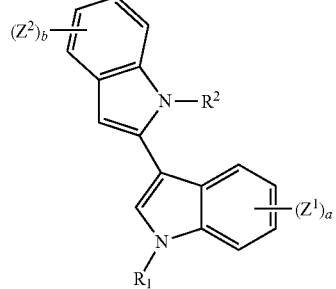

-continued

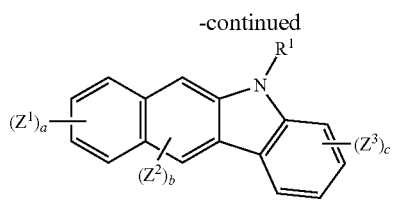
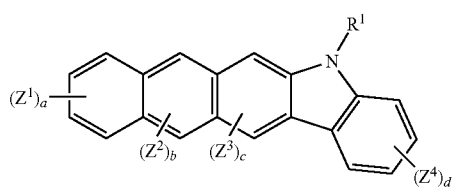
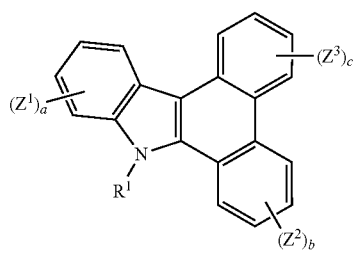
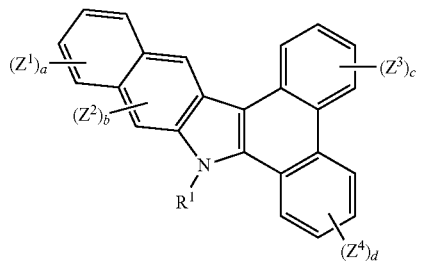
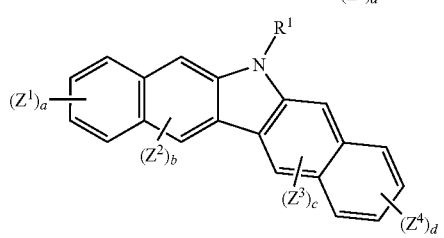
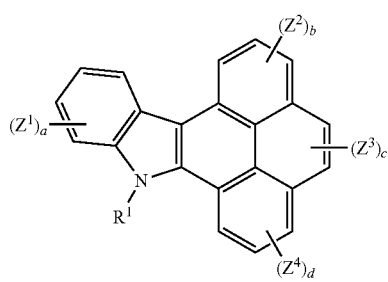
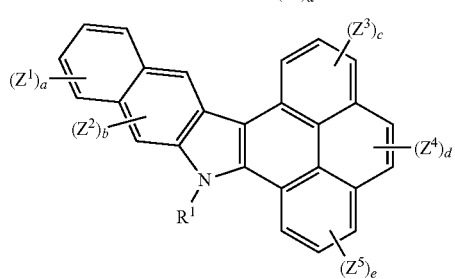

-continued

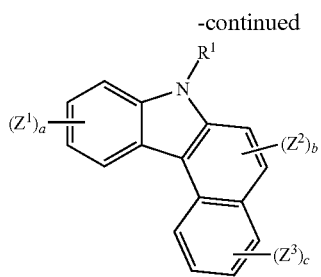

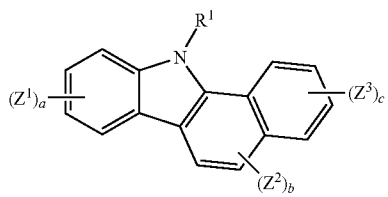

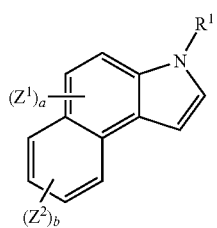

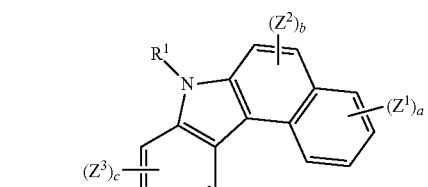

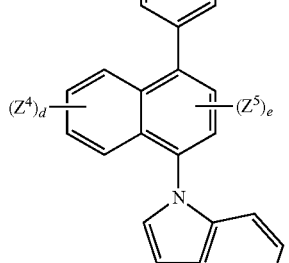

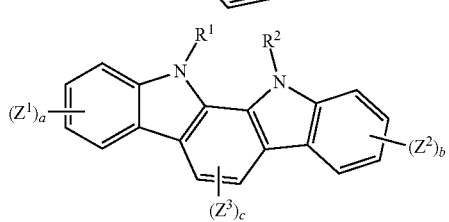

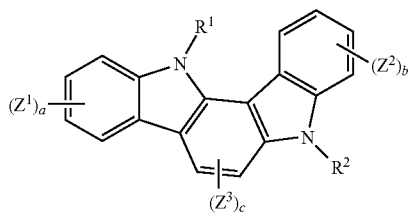

-continued

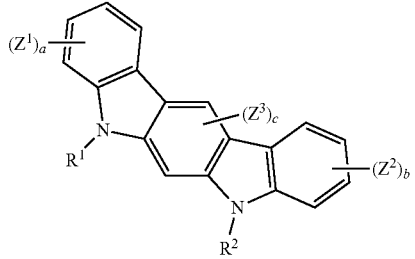

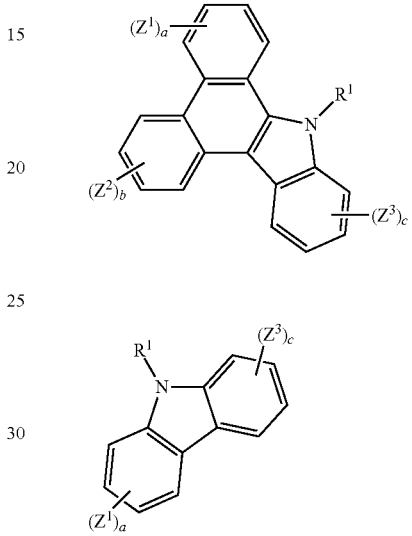

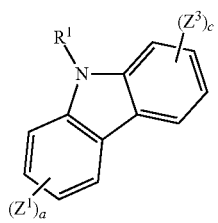

In the above compounds,

R¹, R², and R³ may each independently be or include, e.g., a substituted or unsubstituted C1 to C30 alkyl group, a substituted or unsubstituted C1 to C30 alkyl group interrupted by or including at least one oxygen atom (—O—), a carbonyl (—C(=O)—)-containing group (e.g., in a chain or backbone thereof, between carbon atoms), or a combination thereof, Z¹ to Z⁶ may each independently be or include, e.g., a hydroxy group (—OH), a methoxy group (—OCH₃), an ethoxy group (—OC₂H₅), a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e, and f are each independently an integer of 0 to 2.

In an implementation, R¹, R², and R³ may each independently be, e.g., a group represented by one of Chemical Formulae 3 to 6.

[Chemical Formula 3]

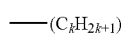

[Chemical Formula 4]

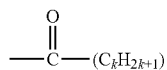

[Chemical Formula 5]

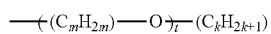

[Chemical Formula 6]

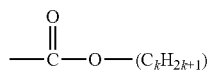

In Chemical Formulae 3 to 6, k, m, and t may each independently be, e.g., an integer of 1 to 10.

In this way, the polymer may include a divalent group derived from or of a nitrogen atom-containing aromatic ring group or compound, may have a structure in which benzylic hydrogen of the ring group is minimized, while a ring parameter is maximized, and thus may help secure excellent etch resistance.

In addition, a nitrogen atom contained in the aromatic ring group may be substituted with a monovalent organic group instead of a hydrogen atom, and the polymer may help secure solubility as well as maintain the etch resistance.

In an implementation, $R^1$, $R^2$, and $R^3$ may each independently be a group including at least three carbons. In an implementation, in Chemical Formula 3, k may be, e.g., an integer of 3 to 10.

In an implementation, in Chemical Formula 6, $-(C_kH_{2k+1})$ may be t-butyl. For example, the group represented by Chemical Formula 6 may be a t-butyl ester group.

Hereinafter, in Chemical Formula 1, the aromatic ring group moiety (e.g., without a nitrogen atom) represented by $A^3$ and $A^4$ is described.

As described above, in Chemical Formula 1, $A^3$ and $A^4$ may each independently be represented by Chemical Formula 2.

[Chemical Formula 2]

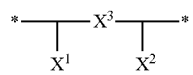

In Chemical Formula 2, $X^1$ and $X^2$ may each independently be or include, e.g., a substituted or unsubstituted C6 to C30 aryl group. In an implementation, the C6 to C30 aryl group may be, e.g., a monovalent group derived from or of one of the following compounds.

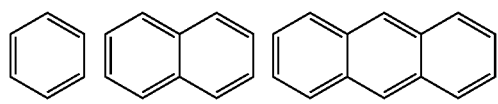

-continued

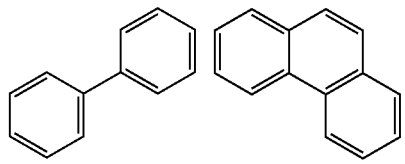

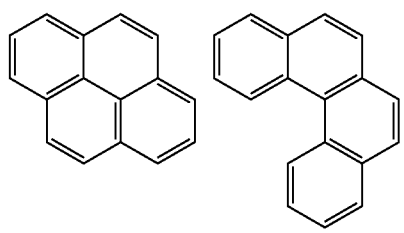

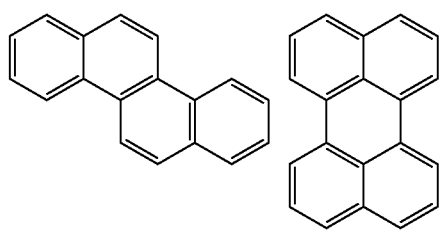

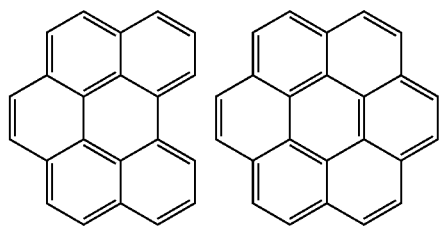

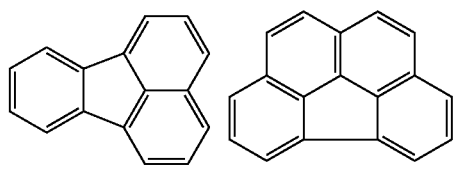

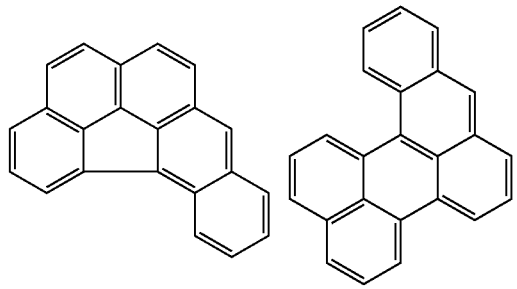

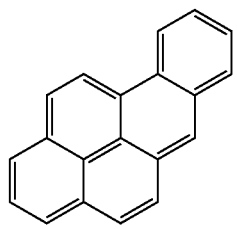

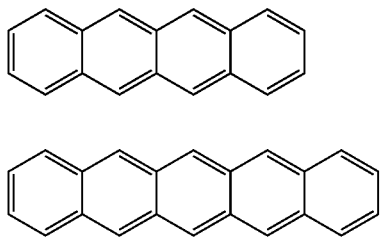

In Chemical Formula 2, $X^3$ may be or may include, e.g., a substituted or unsubstituted C6 to C50 arylene group. In an implementation, the C6 to C50 arylene group may be, e.g., a divalent group derived from or of one of the following compounds.

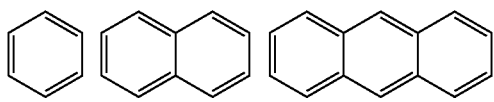

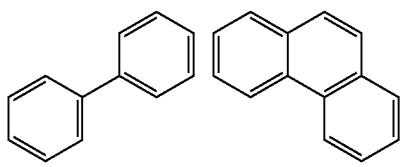

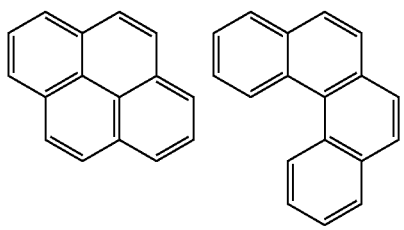

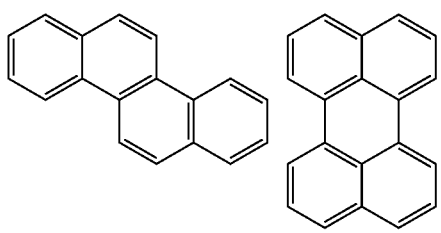

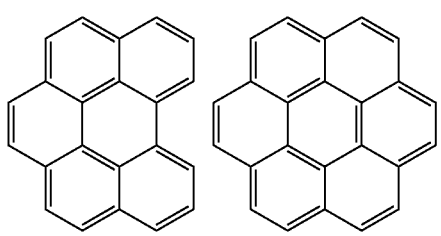

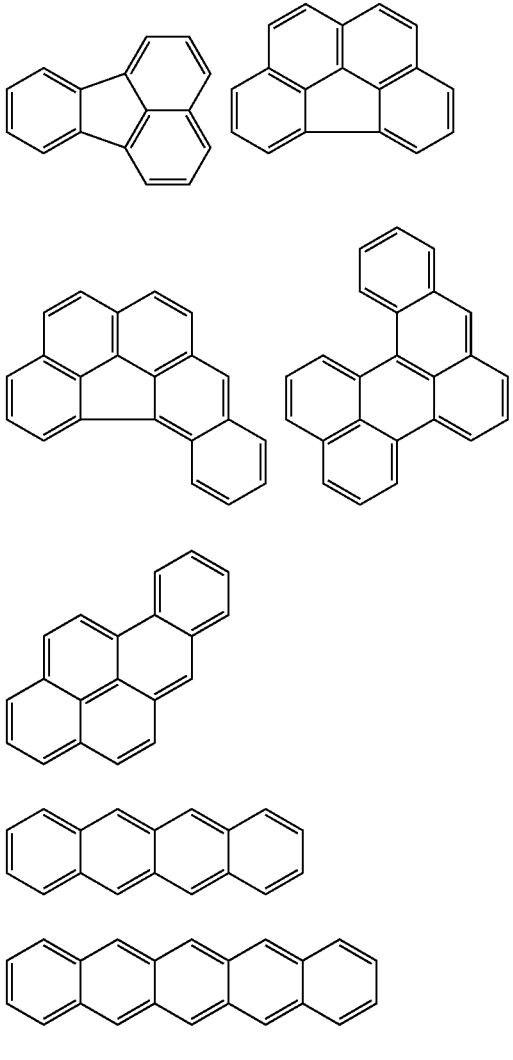

In an implementation, the aromatic ring group moiety without a nitrogen atom represented by Chemical Formula 2 may include a polycyclic aromatic ring group. In an implementation, in Chemical Formula 2, at least one of $X^1$, $X^2$, and $X^3$ may be or may include, e.g. a group derived from a substituted or unsubstituted naphthalene, a substituted or unsubstituted biphenyl, a substituted or unsubstituted pyrene, a substituted or unsubstituted perylene, a substituted or unsubstituted benzoperylene, a substituted or unsubstituted coronene, or a combination thereof. For example, at least one of $X^1$, $X^2$, and $X^3$ may be or include a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof In an implementation, the polymer may include a repeating unit represented by one of Chemical Formulae 1-1 to 1-4.

[Chemical Formula 1-1]
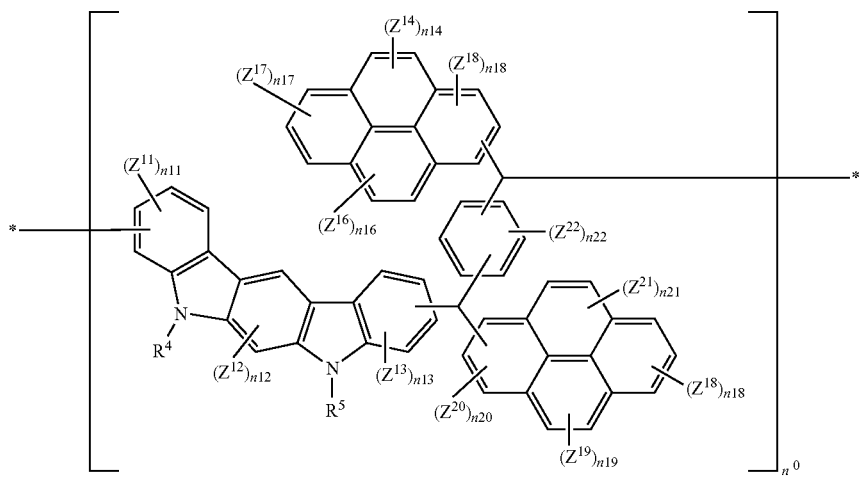
[Chemical Formula 1-2]
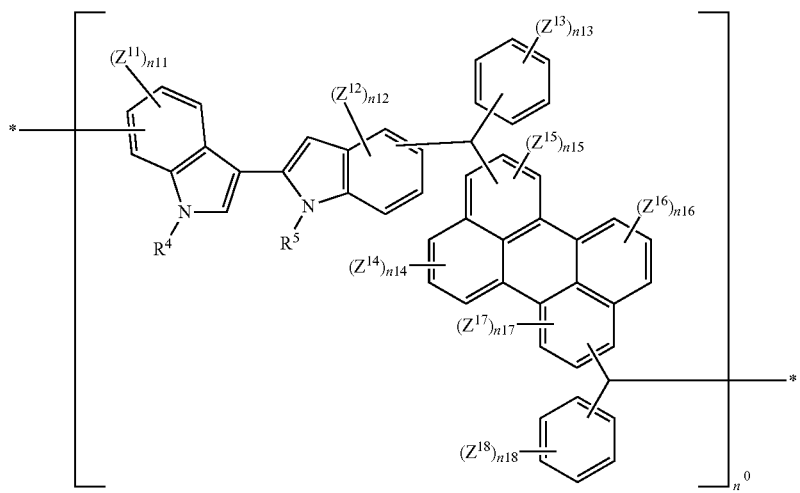
[Chemical Formula 1-3]
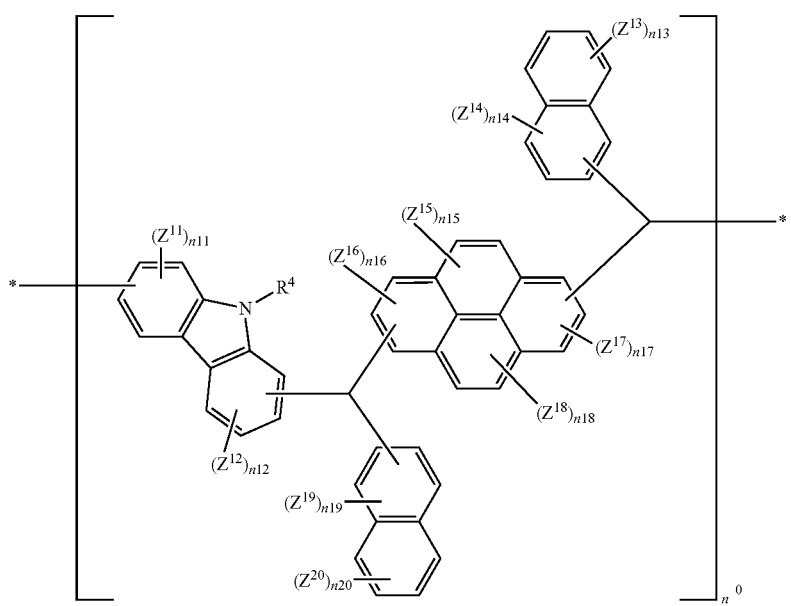

[Chemical Formula 1-4]

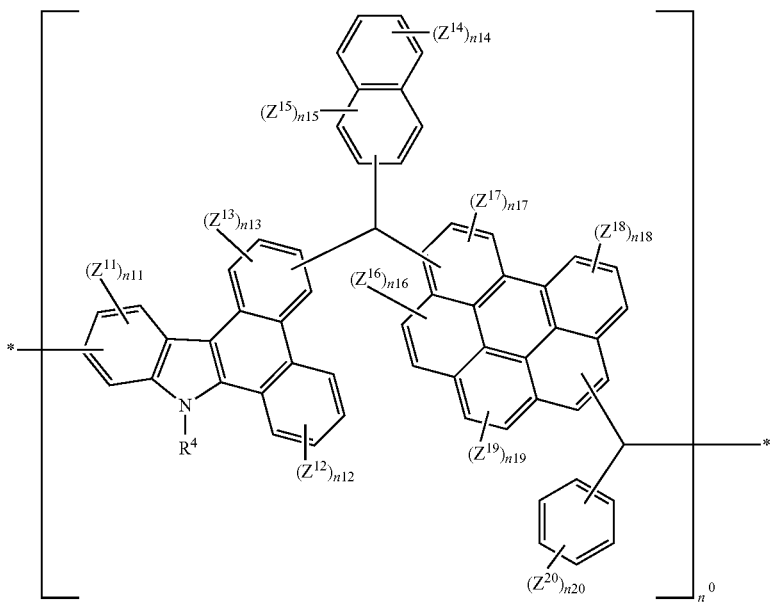

In Chemical Formulae 1-1 to 1-4, $R^4$ and $R^5$ may each independently be or include, e.g., a substituted or unsubstituted C1 to C30 alkyl group, a substituted or unsubstituted C1 to C30 alkyl group interrupted by or including at least one oxygen atom (—O—), a carbonyl (—C(=O)—)-containing group (e.g., in a chain or backbone thereof, between two carbon atoms), or a combination thereof.

$Z^{11}$ to $Z^{22}$ may each independently be or include, e.g., a hydroxy group (—OH), a methoxy group (—OCH$_3$), an ethoxy group (—OC$_2$H$_5$), a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof.

$n^{11}$ to $n^{22}$ may each independently be, e.g., an integer of 0 to 2.

$n^0$ may be, e.g., an integer of 2 to 300.

The polymer may have a weight average molecular weight of, e.g., about 1,000 to about 200,000. When the polymer has a weight average molecular weight within the range, an organic layer composition (e.g., a hard mask composition) including the polymer may be optimized by adjusting the amount of carbon and solubility in a solvent.

According to another embodiment, an organic layer composition including the polymer and a solvent may be provided.

The solvent may have sufficient solubility or dispersion with respect to the polymer. In an implementation, the solvent may include, e.g., at least one selected from propylene glycol, propylene glycol diacetate, methoxy propanediol, diethylene glycol, diethylene glycol butylether, tri (ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, and ethyl 3-ethoxypropionate.

The polymer may be present in an amount of about 0.1 to about 30 wt %, based on a total weight of the organic layer composition. When the polymer is included in the range, a thickness, surface roughness, and planarization of the organic layer may be controlled.

In an implementation, the organic layer composition may further include an additive, e.g., a surfactant, a cross-linking agent, a thermal acid generator, a plasticizer, or the like.

The surfactant may include, e.g., alkylbenzene sulfonate salt, alkyl pyridinium salt, polyethylene glycol, or a quaternary ammonium salt.

The cross-linking agent may include, e.g., a melamine-based, a substituted urea-based, or a polymer-based agent thereof. In an implementation, a cross-linking agent having at least two cross-linking forming substituent may include, e.g., methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or butoxymethylated thiourea, or the like.

In addition, the cross-linking agent may have high heat resistance. The cross-linking agent having high heat resistance may be a compound containing a cross-linking substituent having an aromatic ring (e.g., a benzene ring, a naphthalene ring) in its molecule.

The thermal acid generator may include, e.g., an acidic compound such as p-toluenesulfonic acid, trifluoromethanesulfonic acid, pyridiniump-toluenesulfonic acid, salicylic acid, sulfosalicylic acid, citric acid, benzoic acid, hydroxybenzoic acid, naphthalenecarbonic acid and the like or/and 2,4,4,6-tetrabromocyclohexadienone, benzointosylate, 2-nitrobenzyltosylate, other organosulfonic acid alkylester, or the like.

The additive may be present in an amount of about 0.001 to 40 parts by weight, based on 100 parts by weight of the organic layer composition. When the additive is included within the range, solubility may be improved without changing optical properties of the organic layer composition.

According to another embodiment, an organic layer manufactured using the organic layer composition may be provided. The organic layer may be, e.g., formed by coating the organic layer composition on a substrate and heat-treating it for curing. The organic layer may include, e.g., a hardmask layer, a planarization layer, a sacrificial layer, a filler, or the like, for an electronic device.

Hereafter, a method for forming patterns by using the organic layer composition is described.

A method of forming patterns according to another embodiment may include providing a material layer on a substrate, applying the organic layer composition including the polymer and a solvent heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, e.g., a silicon wafer, a glass substrate, or a polymer substrate.

The material layer may be a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The organic layer composition is the same as described above, and may be applied by spin-on coating in a form of a solution. In an implementation, a thickness of the organic layer composition may be, e.g., about 50 Å to about 10,000 Å.

The heat-treating the organic layer composition may be performed, e.g., at about 100 to about 500° C. for about 10 seconds to 1 hour.

The silicon-containing thin layer may be formed of, e.g., SiCN, SiOC, SiON, SiOCN, SiC and/or SiN or the like.

In an implementation, the method may further include forming a bottom antireflective coating (BARC) before forming the photoresist layer on the silicon-containing thin layer.

Exposure of the photoresist layer may be performed using, e.g., ArF, KrF, or EUV. After exposure, heat treatment may be performed at about 100° C. to about 500° C.

The etching process of the exposed part of the material layer may be performed through a dry etching process using an etching gas. The etching gas may be, e.g., $CHF_3$, $CF_4$, $Cl_2$, $BCl_3$, and a mixed gas thereof.

The etched material layer may be formed in a plurality of patterns. The plurality of patterns may include, e.g., a metal pattern, a semiconductor pattern, an insulation pattern, or the like. For example, the plurality of patterns may include diverse patterns of a semiconductor integrated circuit device.

Hereinafter, the present disclosure is illustrated in more detail with reference to examples. However, these examples are exemplary, and the present disclosure is not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Comparative Synthesis Example 1

20 g (0.1 mol) of pyrene and 38 g (0.2 mol) of naphthoylchloride were put in a 500 ml 2-necked flask equipped with a mechanical agitator and a cooling tube and dissolved in 219 g of 1,2-dichloroethane. Fifteen minutes later, 30 g (0.22 mol) of trichloro aluminum was slowly added thereto, and the reaction solution was reacted at ambient temperature for 5 hours. When the reaction was complete, water was used to remove the trichloro aluminum, and the residue was concentrated with an evaporator. Then, 80 g of tetrahydrofuran was added to the obtained compound, obtaining a solution. Subsequently, 10 g (0.26 mol) of a sodium borohydride aqueous solution was slowly added to the solution, and the mixture was agitated at ambient temperature for 12 hours. When the reaction was complete, the resultant was acidified to a pH of less than or equal to 5 with a 7% HCl solution and extracted with ethyl acetate, and an organic solvent was removed therefrom under a reduced pressure, obtaining a monomer.

6.08 g (0.01 mol) of the monomer, 1.15 g (0.01 mol) of carbazole, 1.9 g (0.01 mol) of p-toluene sulfonic acid hydrate, and 25 g of 1,4-dioxane were put in a flask and agitated at 100° C. When a sample was taken from the polymerization reactant by every hour and had a weight average molecular weight ranging from 2,500 to 4,500, the reaction was complete. When the reaction was complete, 100 g of hexane was added thereto to extract the 1,4-dioxane, water and methanol were added thereto, a precipitate therein was filtered, and a monomer remaining there was removed by using methanol, obtaining a polymer having a repeating unit represented by Chemical Formula X (a weight average molecular weight=about 4,300).

[Chemical Formula X]

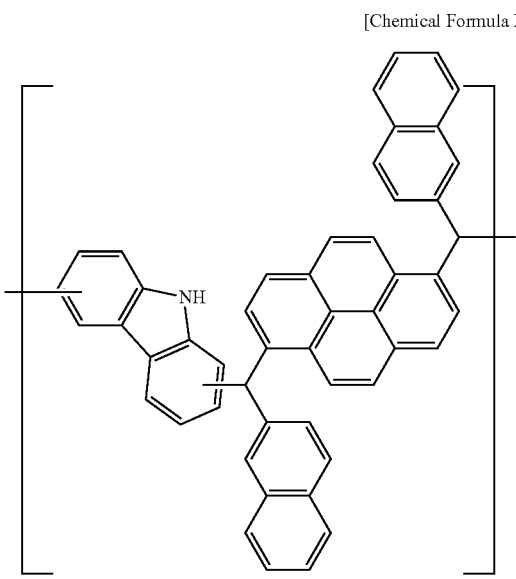

Comparative Synthesis Example 2

27.64 g (0.1 mol) of benzoperylene, 17.06 g (0.1 mol) of 4-methoxybenzoylchloride, and 19 g (0.1 mol) of naphthoylchloride were put in a 250 ml 2-necked flask equipped with a mechanical agitator and a cooling tube and dissolved in 178.12 g of 1,2-dichloroethane. Fifteen minutes later, 15 g (0.11 mol) of trichloro aluminum was slowly added thereto, and the reaction solution was reacted at ambient temperature for 5 hours. When the reaction was complete, water was used to remove the trichloro aluminum, and the residue was concentrated with an evaporator. Then, 30.4 g (0.15 mol) of 1-dodecanethiol, 11.23 g (0.2 mol) of potassium hydroxide, and 229 g of 1-methyl-2-pyrrolidinone (NMP) were added to the obtained compound, and the mixture was agitated at 85° C. Three hours later, when the reaction was complete, a 1N hydrochloric acid aqueous solution and ethyl acetate were added thereto, an ethyl acetate layer was separated therefrom, and a base and a catalyst were removed therefrom. The ethyl acetate layer was concentrated under a reduced pressure, and 80 g of tetrahydrofuran was added thereto, obtaining a solution. Then, 10 g (0.26 mol) of a sodium borohydride aqueous solution was slowly added to the solution, and the mixture was agitated at ambient temperature for 12 hours. When the reaction was complete, the resultant was acidified to a pH of less than or equal to 5 with a 7% HCl solution and extracted with ethyl acetate, and an organic solvent was removed under a reduced pressure, obtaining a monomer.

6.08 g (0.01 mol) of the monomer, 1.15 g (0.01 mol) of 9H-dibenzo[a,c]carbazole, 1.9 g (0.01 mol) of p-toluene sulfonic acid hydrate, and 25 g of 1,4-dioxane were put in a flask and agitated at 100° C. When a sample taken from the polymerization reactant by every hour had a weight average molecular weight ranging from 2,500 to 3,500, the reaction was complete. When the reaction was complete, 100 g of hexane was added thereto to extract the 1,4-dioxane, water and methanol were added thereto, a precipitate therein was filtered, and a monomer remaining there was removed by using methanol, obtaining a polymer having a repeating unit represented by Chemical Formula Y (a weight average molecular weight=about 2,600).

[Chemical Formula Y]

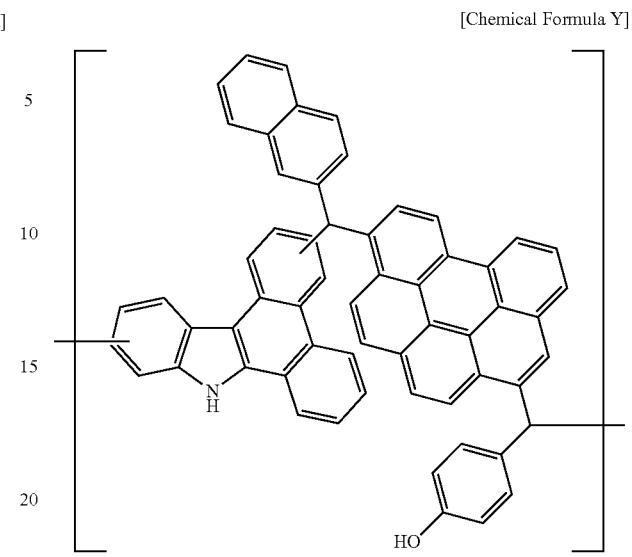

Synthesis Example 1

40.4 g (0.2 mol) of pyrene and 20 g (0.1 mol) of terephthaloyl chloride were put in a 500 ml 2-necked flask equipped with a mechanical agitator and a cooling tube and dissolved in 300 g of 1,2-dichloroethane. Fifteen minutes later, 30 g (0.22 mol) of trichloro aluminum was slowly added thereto, and the reaction solution was reacted at ambient temperature for 5 hours. When the reaction was complete, water was used to remove the trichloro aluminum, and the residue was concentrated with an evaporator. Then, 160 g of tetrahydrofuran was added to the compound, obtaining a solution. Subsequently, 16 g (0.42 mol) of a sodium borohydride aqueous solution was slowly added to the solution, and the mixture was agitated at ambient temperature for 12 hours. When the reaction was complete, the resultant was acidified to a pH of less than or equal to 5 with a 7% HCl solution and extracted with ethyla cetate, and an organic solvent was removed under a reduced pressure, obtaining a monomer.

6.08 g (0.01 mol) of the monomer, 1.93 g (0.01 mol) of 5,7-dihydro-indolo[2,3-b]carbazole, 1.9 g (0.01 mol) of p-toluene sulfonic acid hydrate, and 25 g of 1,4-dioxane were put in a flask and agitated at 100° C. When a sample taken from the polymerization reactant by every hour had a weight average molecular weight of 2,500 to 3,500, the reaction was complete. When the reaction was complete, 100 g of hexane was added thereto to extract the 1,4-dioxane, water and methanol were added thereto, a precipitate therein was filtered, and a monomer remaining therein was removed by using methanol, obtaining a polymer.

7.79 g (0.01 mol) of the polymer, 3.05 g (0.02 mol) of 1-(2-chloroethoxy)-2-ethoxyethane, 2.16 g (0.09 mol) of sodium hydride, and 48.17 g of tetrahydrofuran were put in a flask and agitated at ambient temperature. Three hours later, the reaction was complete. When the reaction was complete, the sodium hydride was removed with an ammonium chloride aqueous solution in a saturated state and dichloromethane, and a dichloromethane layer was removed. The residue was concentrated under a reduced pressure and added to hexane, a precipitate therein was filtered, obtaining a polymer having a repeating unit represented by Chemical Formula A (a weight average molecular weight=about 3,300).

ammonium chloride aqueous solution in a saturated state and dichloromethane were used to remove the potassium hydride, a dichloromethane layer was removed, the residue

[Chemical Formula A]

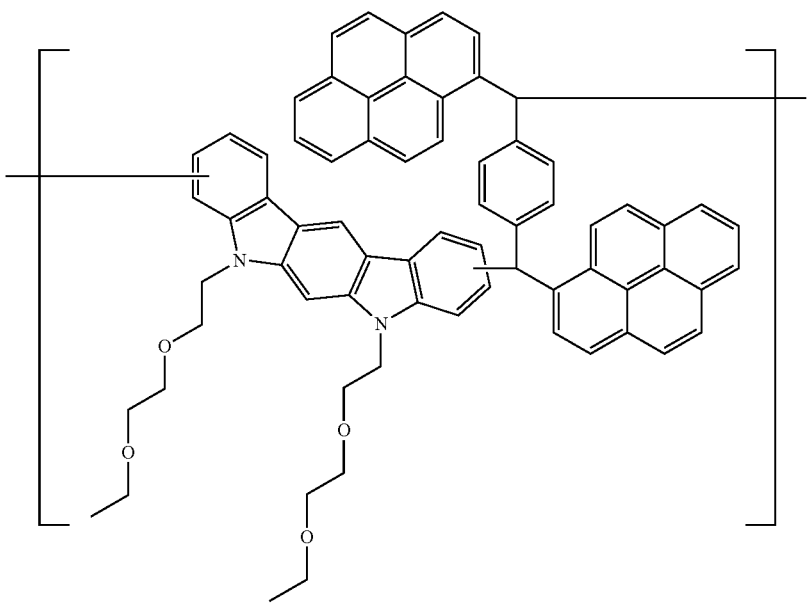

Synthesis Example 2

30.0 g (0.1 mol) of perylene and 34 g (0.2 mol) of benzoylchloride were put in a 500 ml 2-necked flask equipped with a mechanical agitator and a cooling tube and dissolved in 300 g of 1,2-dichloroethane. Fifteen minutes later, 30 g (0.22 mol) of trichloro aluminum was slowly added thereto, and the reaction solution was reacted at ambient temperature for 5 hours. When the reaction was complete, water was used to remove the trichloro aluminum, and the residue was concentrated with an evaporator. Then, 160 g of tetrahydrofuran was added to the compound, obtaining a solution. Subsequently, 16 g (0.42 mol) of a sodium borohydride aqueous solution was slowly added to the solution, and the mixture was agitated at ambient temperature for 12 hours. When the reaction was complete, the resultant was acidified to a pH of less than or equal to 5 with a 7% HCl solution and extracted with ethyl acetate, and an organic solvent was removed therefrom under a reduced pressure, obtaining a monomer.

6.08 g (0.01 mol) of the monomer, 1.93 g (0.01 mol) of 2,3'-biindole, 1.9 g (0.01 mol) of p-toluene sulfonic acid hydrate, and 25 g of 1,4-dioxane were put in a flask and agitated at 100° C. When a sample taken from the polymerization reactant by every hour had a weight average molecular weight of 2,500 to 3,500, the reaction was complete. When the reaction was complete, 100 g of hexane was added thereto to extract the 1,4-dioxane, water and methanol was added thereto, a precipitate therein was filtered, and a monomer remaining there was removed by using methanol, obtaining a polymer.

6.81 g (0.01 mol) of the polymer, 2.42 g (0.02 mol) of 1-chlorohexane, 2.16 g (0.09 mol) of potassium hydride, and 48.37 g of dimethyl formamide were put in a flask and agitated at ambient temperature. Two hours later, the reaction was complete. When the reaction was complete, an was concentrated under a reduced pressure and added to hexane, and a precipitate therein was filtered, obtaining a polymer having a repeating unit represented by Chemical Formula B (a weight average molecular weight=about 3,100).

[Chemical Formula B]

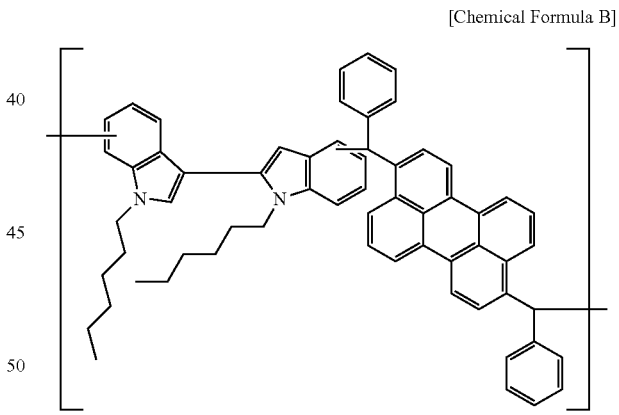

Synthesis Example 3

6.63 g (0.01 mol) of the polymer of Comparative Synthesis Example 1, 3.27 g (0.015 mol) of di-tert-butyl dicarbonate (BOC), 3.27 g (0.003 mol) of 4-dimethylaminopyridine, and 37.09 g of dichloromethane were put in a flask and agitated at ambient temperature. Twenty four hours later, the reaction was complete. When the reaction was complete, water was added thereto, and a dichloromethane layer was separated to remove DMAP. The extracted dichloromethane layer was added to sodium sulfate, and water was removed by filtering the mixture. The residue was concentrated under a reduced pressure and added to hexane, and a precipitate therein was filtered, obtaining a polymer having a repeating unit represented by Chemical Formula C (a weight average molecular weight=about 4,200).

[Chemical Formula C]

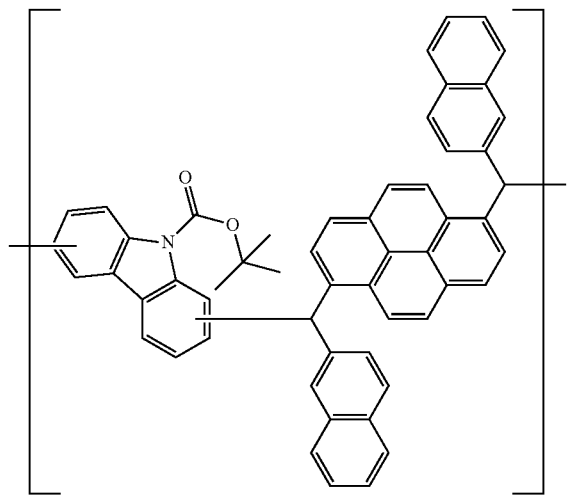

Synthesis Example 4

8.04 g (0.01 mol) of the polymer Comparative Synthesis Example 2, 1.35 g (0.01 mol) of hexanoylchloride, 2.25 g (0.04 mol) of potassium hydroxide, and 42.58 g of dimethyl formamide were put in a flask and agitated at ambient temperature. Four hours later, the reaction was complete. When the reaction was complete, an ammonium chloride aqueous solution in a saturated state and dichloromethane were used to remove the potassium hydroxide. Then, a dichloromethane layer was taken and concentrated under a reduced pressure and then, added to hexane. Subsequently, a precipitate in the reactant was filtered, obtaining a polymer having a repeating unit represented by Chemical Formula D (a weight average molecular weight=about 2,730).

[Chemical Formula D]

Solubility of Polymer

Each polymer according to Comparative Synthesis Examples 1 and 2 and Synthesis Examples 1 to 4 was dissolved in 20 g of an ethyl lactate (EL) solvent at 25° C., and the mass of the compound dissolved therein was examined.

Subsequently, the process was repeated by using 20 g of propylene glycolmonomethyl ether acetate (PGMEA) and 20 g of propylene glycolmonomethylether (PGME) instead of the ethyl lactate (EL).

Solubility of each polymer was evaluated by a percentage of the mass of the polymer dissolved in 20 g of each solvent at 25° C.

Solubility (%)=Polymer Mass (g)/Solvent Mass (g)

The results are provided in Table 1.

TABLE 1

|  | EL (%) | PGMEA (%) | PGME (%) |
| --- | --- | --- | --- |
| Comparative Synthesis Example 1 | 25.8 | 12.5 | 24.9 |
| Comparative Synthesis Example 2 | 15.4 | 0 | 8.7 |
| Synthesis Example 1 | 50.7 | 23.8 | 55.7 |
| Synthesis Example 2 | 37.1 | 38.7 | 47.1 |
| Synthesis Example 3 | 54.5 | 42.5 | 55.3 |
| Synthesis Example 4 | 44.6 | 19.4 | 31.2 |

Referring to Table 1, the polymers according to Synthesis Examples 1 to 4 showed excellent solubility characteristics, compared with the polymers according to Comparative Synthesis Examples 1 and 2.

Preparation of Hardmask Compositions

Example 1

The compound of Synthesis Example 1 was dissolved in a mixed solvent of propylene glycolmonomethyl ether acetate (PGMEA) and cyclohexanone (7:3 (v/v)) and filtered, preparing a hardmask composition.

Example 2

A hardmask composition was prepared according to the same method as Example 1 except for using the compound of Synthesis Example 2 instead of the compound of Synthesis Example 1.

Example 3

A hardmask composition was prepared according to the same method as Example 1 except for using the compound of Synthesis Example 3 instead of the compound of Synthesis Example 1.

Example 4

A hardmask composition was prepared according to the same method as Example 1 except for using the compound of Synthesis Example 4 instead of the compound of Synthesis Example 1.

Comparative Example 1

A hardmask composition was prepared according to the same method as Example 1 except for using the compound of Comparative Synthesis Example 1 instead of the compound of Synthesis Example 1.

Comparative Example 2

A hardmask composition was prepared according to the same method as Example 1 except for using the compound of Comparative Synthesis Example 1 instead of the compound of Synthesis Example 2.

Etch Resistance Evaluation

Each hardmask composition (a compound content: 12 to 15 wt %) according to Examples 1 to 4 and Comparative Example 1 was spun-on coated to be 4,000 Å thick on a silicon wafer and heat-treated at 400° C. for 90 seconds on a hot plate, forming a thin film.

Subsequently, the thickness of the thin film was measured. Then, the thin film was dry-etched by using $CHF_3/CF_4$ mixed gas and $N_2/O_2$ mixed gas for 100 seconds and 60 seconds respectively, and then, the thickness of the thin film was measured again. The thickness of the thin film before and after the dry etching and etching time were used to calculate a bulk etch rate (BER) according to Calculation Equation 1.

(Initial thin film thickness−Thin film thickness after etching)/etching time (Å/s)   [Calculation Equation 1]

The results are provided in Table 2.

TABLE 2

|  | CFx | $N_2/O_2$ |
|---|---|---|
| Comparative Example 1 | 25.96 | 26.85 |
| Example 1 | 23.89 | 24.93 |
| Example 2 | 23.57 | 24.88 |
| Example 3 | 25.82 | 25.19 |
| Example 4 | 23.24 | 21.91 |

Referring to Table 2, the thin films respectively formed of the hardmask composition Examples 1 to 4 had sufficient etch resistance to etching gas and exhibited improved bulk etch characteristics, compared with the thin film formed of the hardmask composition according to Comparative Example 1.

Storage Stability Evaluation

The hardmask compositions (a compound content: 10 wt %) according to Examples 1 to 4 and Comparative Example 2 were respectively dissolved in ethyl lactate (EL) and stored in a clean room blocked from ultraviolet (UV) and set at 23° C. for one month, and their changes in a tendency curved line were investigated by using gel permeation chromatography (GPC). A change in the tendency curved line was evaluated as no storage stability ('X'), while no change in the tendency curved line was evaluated as storage stability ('O').

The results are provided in Table 3.

TABLE 3

|  | Storage stability |
|---|---|
| Comparative Example 2 | X |
| Example 1 | O |
| Example 2 | O |
| Example 3 | O |
| Example 4 | O |

Referring to Table 3, the hardmask compositions according to Examples 1 to 4 showed excellent storage stability, compared with the hardmask composition according to Comparative Example 2.

By way of summation and review, according to small-sizing the pattern to be formed, it may be difficult to provide a fine pattern having an excellent profile using some lithographic techniques. Accordingly, a layer, called a hardmask layer, may be formed between the material layer and the photoresist layer to provide a fine pattern. The hardmask layer plays a role of an intermediate layer for transferring the fine pattern of photoresist to the material layer through the selective etching process. Accordingly, the hardmask layer may have characteristics such as heat resistance and etch resistance, and the like to be tolerated during the multiple etching processes. A hardmask layer may be formed by a spin-on coating method or a chemical vapor deposition. The spin-on coating method may be easy to perform and may also improve gap-fill characteristics and planarization characteristics. In order to perform a spin-on coating method, a material to be coated must be soluble in a solvent. The embodiments provide an organic layer material satisfying the characteristics for a hardmask layer.

The embodiments may provide a polymer that simultaneously helps provide or ensure solubility in a solvent, etch resistance, and storage stability.

The embodiments may provide a polymer that simultaneously helps provide or ensure etch resistance and planarization characteristics.

An organic layer material having improved dissolution, etch resistance and storage stability may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polymer including a moiety represented by Chemical Formula 1:

   [Chemical Formula 1]

wherein, in Chemical Formula 1,
$A^1$ and $A^2$ are each independently a divalent nitrogen atom-containing aromatic ring group, provided that the nitrogen atom of the divalent nitrogen atom-containing aromatic ring group is bonded with a substituted or unsubstituted C1 to C30 alkyl group, a substituted or unsubstituted C1 to C30 alkyl group including at least one oxygen atom (—O—), a carbonyl (—C(=O)—)-containing group, or a combination thereof,
$A^3$ and $A^4$ are each independently a divalent group represented by Chemical Formula 2, and
n is 0 or 1,

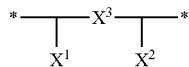   [Chemical Formula 2]

wherein, in Chemical Formula 2,
$X^1$ and $X^2$ are each independently substituted or unsubstituted C6 to C30 aryl group, and $X^3$ is a substituted or unsubstituted C6 to C50 arylene group, and
wherein * indicates a linking point.
2. The polymer as claimed in claim 1, wherein the divalent nitrogen atom-containing aromatic ring group is a divalent group of one of the following compounds:
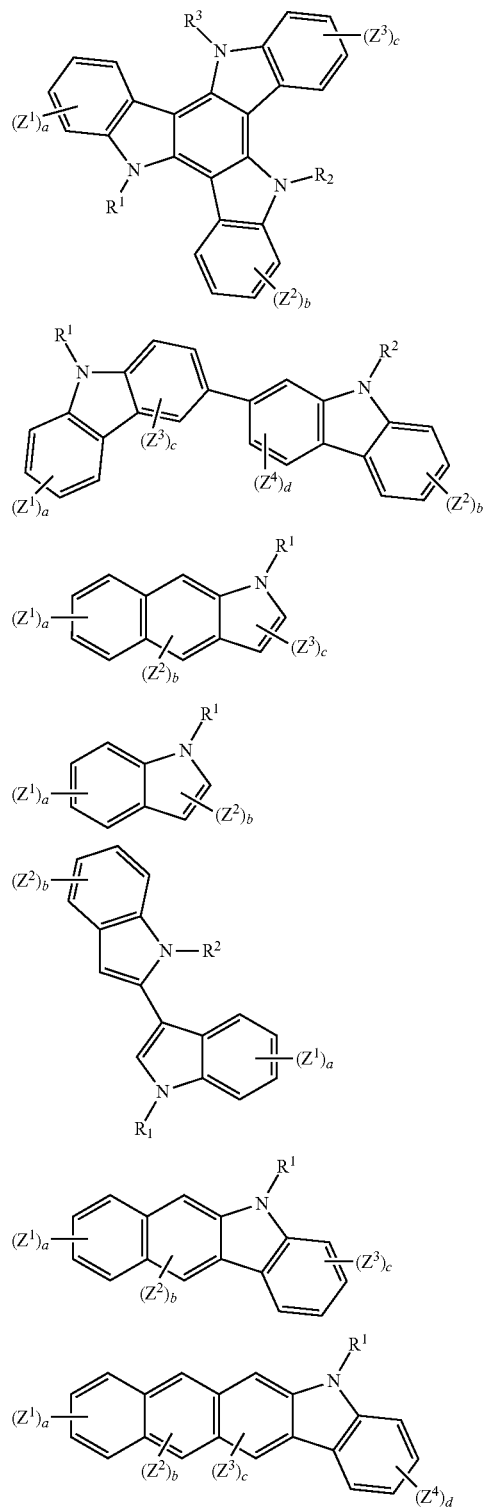
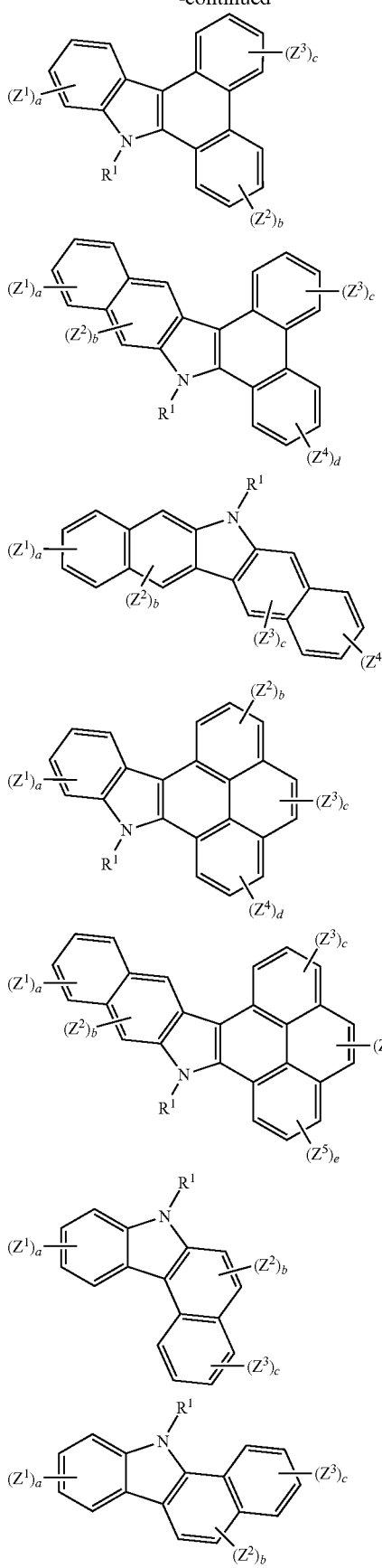

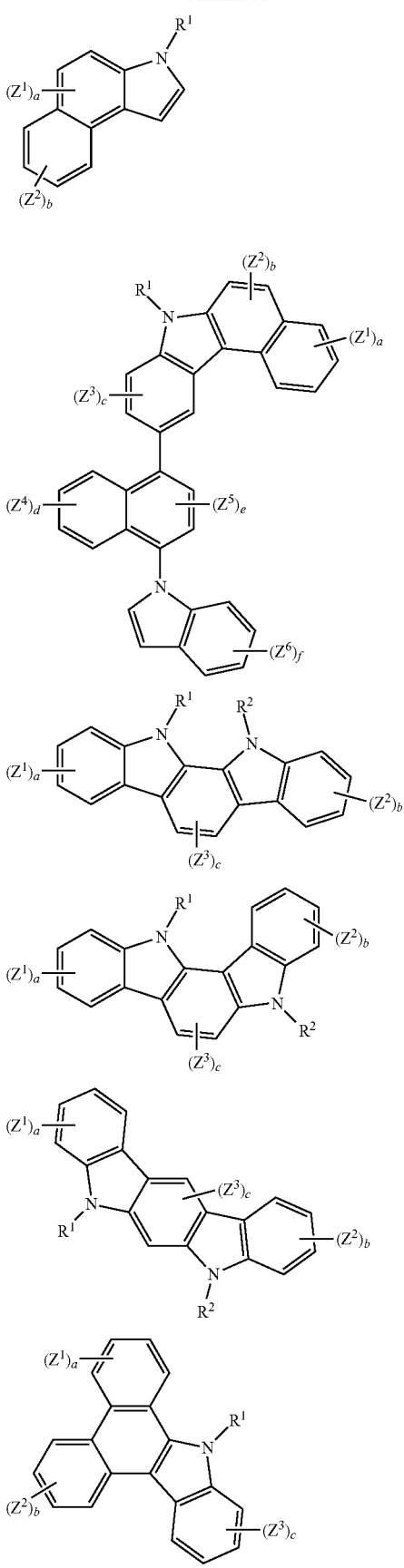

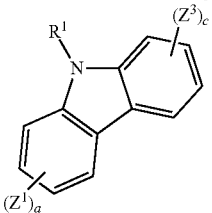

wherein, in the above compounds, $R^1$, $R^2$, and $R^3$ are each independently a substituted or unsubstituted C1 to C30 alkyl group, a substituted or unsubstituted C1 to C30 alkyl group including at least one oxygen atom (—O—), a carbonyl (—C(=O)—)-containing group, or a combination thereof, $Z^1$ to $Z^6$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e, and f are each independently an integer of 0 to 2.

3. The polymer as claimed in claim 2, wherein $R^1$, $R^2$, and $R^3$ are each independently a group including at least three carbons.

4. The polymer as claimed in claim 2, wherein $R^1$, $R^2$, and $R^3$ are each independently a group represented by one of Chemical Formulae 3 to 6:

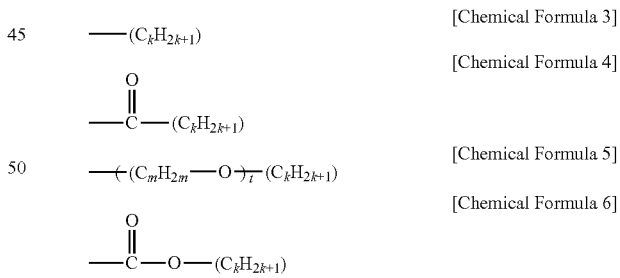

wherein in Chemical Formulae 3 to 6, k, m, and t are each independently an integer of 1 to 10.

5. The polymer as claimed in claim 4, wherein, in Chemical Formula 3, k is an integer of 3 to 10.

6. The polymer as claimed in claim 4, wherein, in Chemical Formula 6, —($C_kH_{2k+1}$) is a t-butyl group.

7. The polymer as claimed in claim 1, wherein, in Chemical Formula 2, the C6 to C30 aryl group is a monovalent group including one of the following moieties:

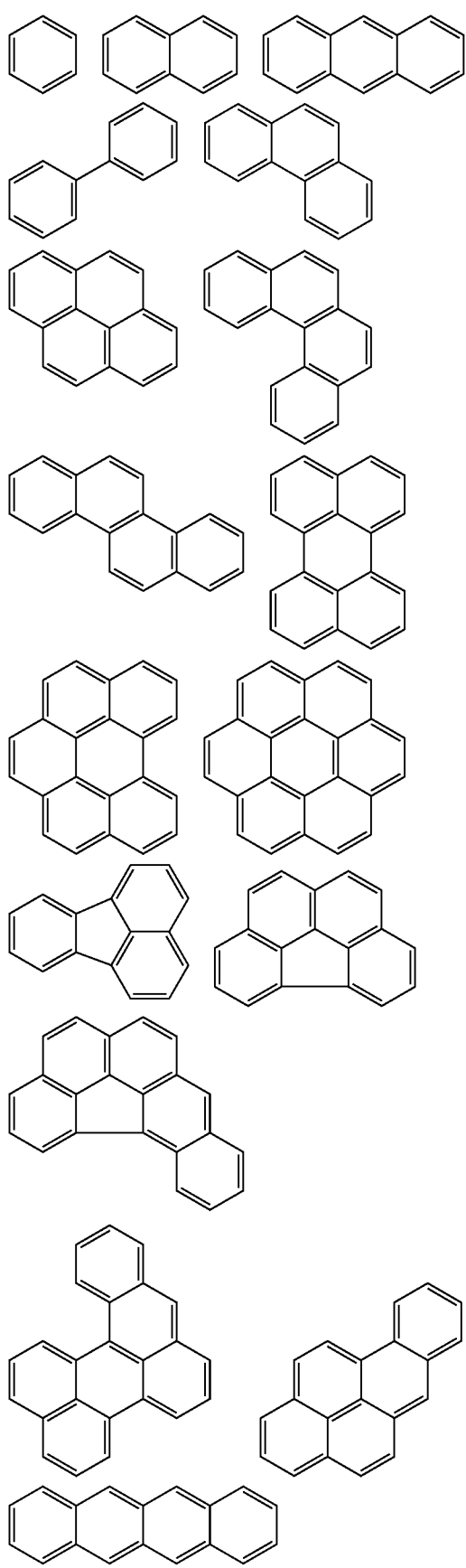
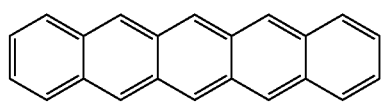 [SMILES: c1ccc2cc3cc4cc5ccccc5cc4cc3cc2c1]
and
the C6 to C50 arylene group is a divalent group including one of the following moieties:
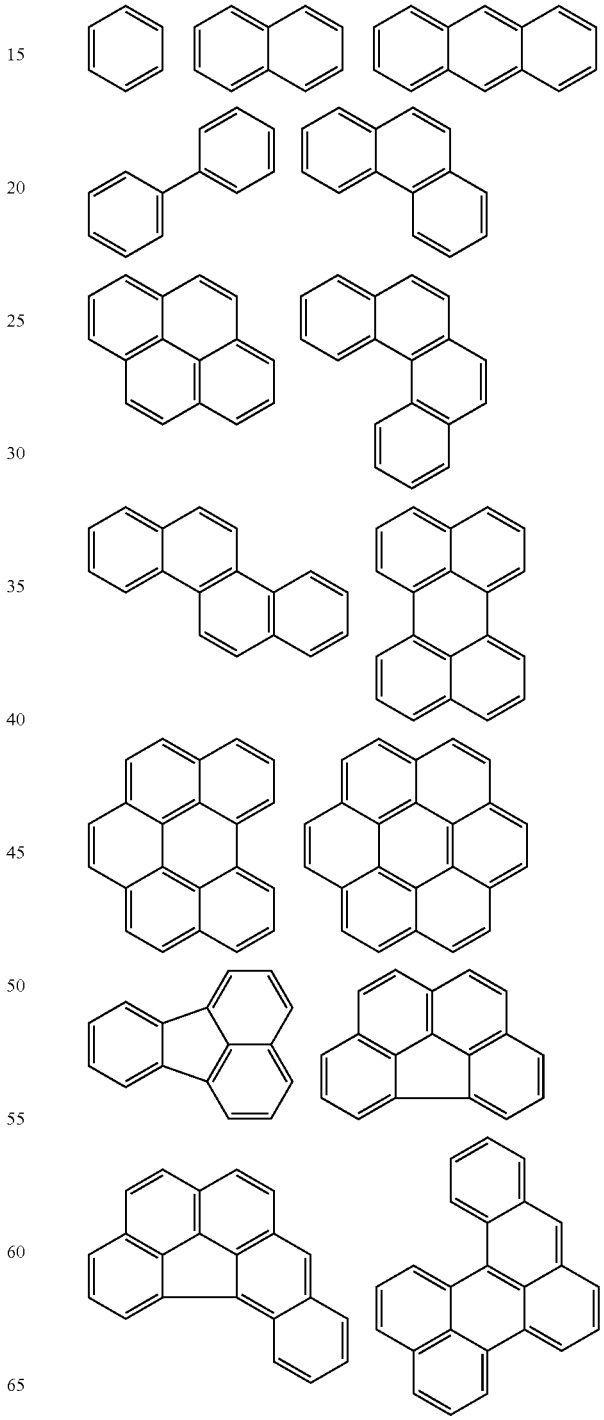

-continued

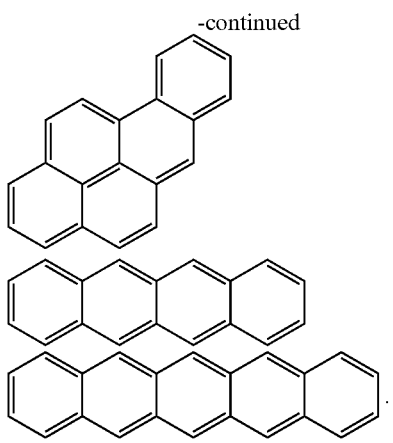

8. The polymer as claimed in claim 1, wherein, in Chemical Formula 2, at least one of $X^1$, $X^2$, and $X^3$ is a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

9. The polymer as claimed in claim 1, wherein the polymer includes a repeating unit represented by one of Chemical Formulae 1-1 to 1-4:

[Chemical Formula 1-1]

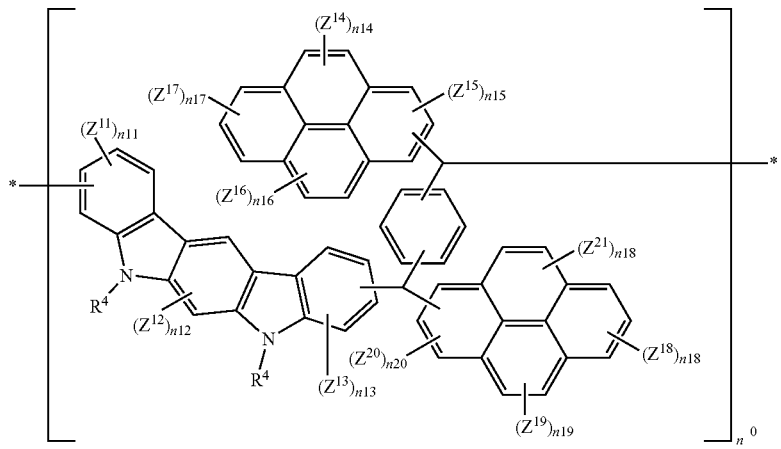

[Chemical Formula 1-2]

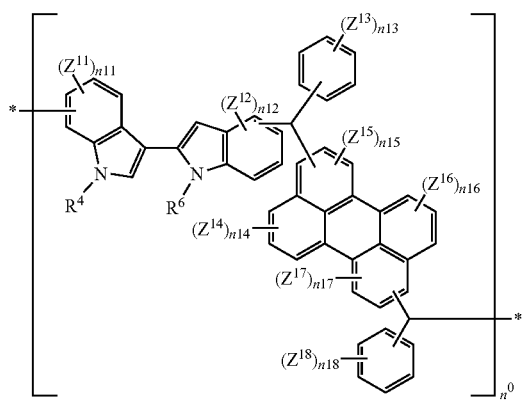

[Chemical Formula 1-3]

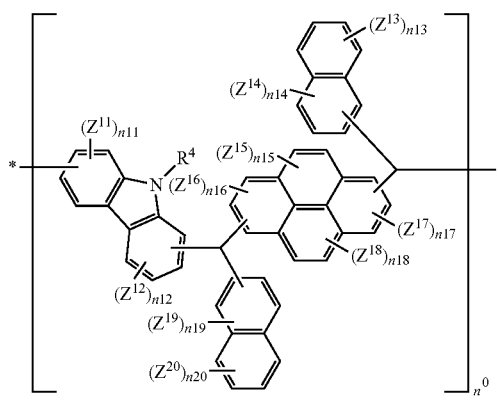

[Chemical Formula 1-4]

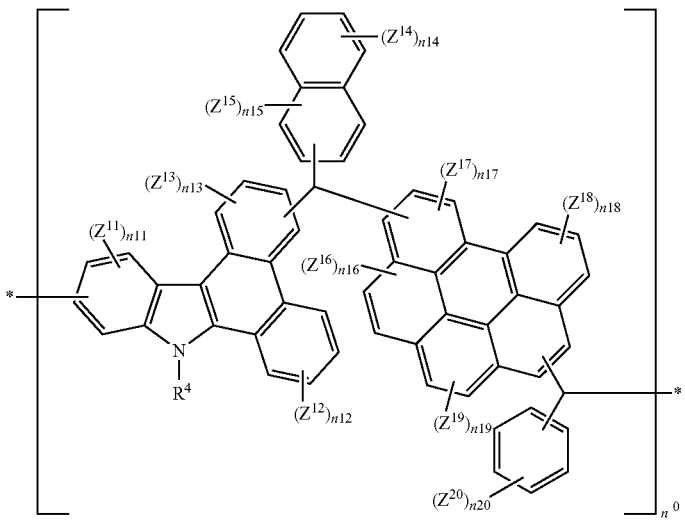

wherein, in Chemical Formulae 1-1 to 1-4, $R^4$ and $R^5$ are each independently a substituted or unsubstituted C1 to C30 alkyl group, a substituted or unsubstituted C1 to C30 alkyl group including at least one oxygen atom (—O—), a carbonyl (—C(=O)—)-containing group, or a combination thereof, $Z^{11}$ to $Z^{22}$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, $n^{11}$ to $n^{22}$ are each independently an integer of 0 to 2, $n^0$ is an integer of 2 to 300, and

* indicates a linking point.

10. The polymer as claimed in claim 1, wherein the polymer has a weight average molecular weight of about 1,000 to about 200,000.

11. An organic layer composition, comprising:
the polymer as claimed in claim 1; and
a solvent.

12. The organic layer composition as claimed in claim 11, wherein the polymer is present in an amount of about 0.1 wt % to about 30 wt %, based on a total weight of the organic layer composition.

13. A method of forming patterns, the method comprising:
providing a material layer on a substrate;
applying the organic layer composition as claimed in claim 11 on the material layer;
heat-treating the organic layer composition to form a hard mask layer;
forming a silicon-containing thin layer on the hard mask layer;
forming a photoresist layer on the silicon-containing thin layer;
exposing and developing the photoresist layer to form a photoresist pattern;
selectively removing the silicon-containing thin layer using the photoresist pattern to expose a part of the material layer; and
etching an exposed part of the material layer.

14. The method as claimed in claim 13, wherein applying the organic layer composition includes performing a spin-on coating method.

15. The method as claimed in claim 13, wherein heat-treating the organic layer is performed at about 100° C. to about 500° C.

16. The method as claimed in claim 13, further comprising forming a bottom antireflective coating prior to forming the photoresist layer.

17. The method as claimed in claim 13, wherein the silicon-containing thin layer includes SiCN, SiOC, SiON, SiOCN, SiC, SiN, or a combination thereof.

* * * * *